United States Patent
Kim et al.

(10) Patent No.: US 7,488,694 B2
(45) Date of Patent: Feb. 10, 2009

(54) METHODS OF FORMING SILICON NITRIDE LAYERS USING NITROGENOUS COMPOSITIONS

(75) Inventors: Jin-Gyun Kim, Gyeonggi-do (KR);
Jae-Young Ahn, Gyeonggi-do (KR);
Hee-Seok Kim, Gyeonggi-do (KR);
Ju-Wan Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 338 days.

(21) Appl. No.: 11/031,611

(22) Filed: Jan. 7, 2005

(65) Prior Publication Data

US 2005/0159017 A1    Jul. 21, 2005

(30) Foreign Application Priority Data

Jan. 8, 2004    (KR)    ............... 10-2004-0001117

(51) Int. Cl.
    *H01L 21/44*    (2006.01)
(52) U.S. Cl. ............ 438/791; 438/792; 257/E21.293
(58) Field of Classification Search ........... 438/791, 438/792
    See application file for complete search history.

(56) References Cited

U.S. PATENT DOCUMENTS

| | | | |
|---|---|---|---|
| 5,968,611 A | 10/1999 | Kaloyeros et al. | |
| 6,106,898 A | 8/2000 | Takamatsu et al. | |
| 6,468,924 B2 | 10/2002 | Lee et al. | |
| 6,468,942 B1 * | 10/2002 | Sansalone | 502/402 |
| 6,508,879 B1 | 1/2003 | Hashimoto | |
| 6,511,539 B1 * | 1/2003 | Raaijmakers | 117/102 |
| 6,767,582 B1 * | 7/2004 | Elers | 427/253 |

FOREIGN PATENT DOCUMENTS

| | | |
|---|---|---|
| JP | 11-217673 A | 8/1999 |
| JP | 2001-144325 A | 5/2001 |
| KR | 10-2002-0044422 | 6/2002 |
| KR | 2003-0001579 A | 1/2003 |

OTHER PUBLICATIONS

Notice to Submit a Response for Korean Patent Application No. 10-2004-0001117 mailed on Oct. 24, 2005.

* cited by examiner

*Primary Examiner*—Alexander G Ghyka
(74) *Attorney, Agent, or Firm*—Myers Bigel Sibley & Sajovec, PA

(57) ABSTRACT

The present invention provides nitrogenous compositions for forming a silicon nitride layer, wherein the nitrogenous composition comprises a hydrazine compound, an amine compound or a mixture thereof. The present invention further provides source compositions for forming a silicon nitride layer, wherein the source composition comprises a nitrogenous composition comprising a hydrazine compound, an amine compound or a mixture thereof, and a silicon source comprising hexachlorodisilane. Methods for forming silicon nitride layers are further provided. The silicon nitride layers provided herein may be formed on a substrate at a low temperature and may further exhibit improved breakdown voltage and an enhanced etch resistance.

11 Claims, 4 Drawing Sheets

METHODS OF FORMING SILICON NITRIDE LAYERS USING NITROGENOUS COMPOSITIONS

RELATED APPLICATION

This application claims the benefit under 35 U.S.C. § 119 to Korean Patent Application No. 2004-1117, filed on Jan. 8, 2004, the disclosure of which is incorporated herein by reference in its entirety as if set forth fully herein.

FIELD OF THE INVENTION

The present invention relates to nitrogenous compositions that may be used as a source for forming silicon nitride layers, and methods for forming silicon nitride layers using the nitrogenous compositions. More particularly, the present invention relates to nitrogenous compositions including a hydrazine compound, an amine compound or a mixture thereof for forming at a low temperature a dense silicon nitride layer having desirable characteristics, and methods for forming such silicon nitride layers using the nitrogenous compositions.

BACKGROUND OF THE INVENTION

In general processes for manufacturing a semiconductor device, a nitride layer may be used as a hard mask, a spacer, an etch-stop layer, and the like. The silicon nitride layer may be formed on a pattern or a substrate by a chemical vapor deposition (CVD) process or an atomic layer deposition (ALD) process using a silicon source such as dichlorosilane (DCS) or hexachloro disilane (HCD; $Si_2Cl_6$) and a nitrogen source such as ammonia ($NH_3$).

When a silicon nitride layer is formed by a low pressure chemical vapor deposition (LPCVD) process using dichlorosilane as a silicon source and using ammonia as a nitrogen source, the silicon nitride layer may have a dense structure. However, because a silicon wafer upon which the silicon nitride layer is formed may be exposed to a high temperature of above about 700° C. for a specified period of time, the silicon wafer may exhibit thermal damage in which impurities are diffused from the silicon wafer. As a result, a semiconductor device formed on the silicon wafer may have undesirable electrical characteristics, and conductive structures of the semiconductor device may show a greater extent of deterioration. To prevent this degree of thermal damage to the silicon wafer, a silicon nitride layer may be formed at a relatively low temperature.

When a silicon nitride layer is formed at a low temperature of below about 600° C. using hexachlorodisilane and ammonia, the silicon nitride layer may not possess a dense structure, and the silicon nitride layer may possess a high etching rate because, for instance, ammonia may not be easily dissociated at the low temperature. Since the silicon nitride layer may exhibit a high etching rate with respect to an etching solution for etching a nitride layer, the silicon nitride layer may not be employed as an etch stop layer or a hard mask layer in a semiconductor device. Additionally, because the silicon nitride layer may have undesirable electrical characteristics such as a low breakdown voltage, the semiconductor device including the silicon nitride layer may also have undesirable electrical characteristics. Thus, a source composition for forming a dense silicon nitride layer at a low temperature is desirable.

A conventional method for forming a nitride layer by a CVD process is described in Japanese Patent Laid Open Publication No. 1999-217673 and U.S. Pat. No. 6,106,898. In Japanese Patent Laid Open Publication No. 1999-217673, a nitrogen source including tertiary-butyl-hydrazine, having a dissociation rate higher than that of ammonia at a low temperature, is used for forming an innoxious nitride layer on a substrate.

In addition, Japanese Patent Laid Open Publication No. 2001-144325 describes a method for manufacturing a compound semiconductor device including a nitride-based material. According to Japanese Patent Laid Open Publication No. 2001-144325, hydrazine or substituted hydrazine is used for forming a nitride layer instead of ammonia, which as noted previously, may not be easily dissociated at a low temperature.

Although the above-mentioned methods use a nitrogen source for forming a nitride layer, a silicon source is not considered in the formation of a silicon nitride layer.

SUMMARY OF THE INVENTION

The present invention provides nitrogenous compositions for forming a silicon nitride layer at a low temperature wherein the silicon nitride layer has desirable characteristics.

Embodiments of the present invention provide nitrogenous compositions for forming a silicon nitride layer, wherein the nitrogenous composition includes a hydrazine compound, an amine compound or a mixture thereof.

Embodiments of the present invention further provide source compositions for forming a silicon nitride layer, wherein the source composition includes a, nitrogenous composition including a hydrazine compound, an amine compound or a mixture thereof, and a silicon source including hexachlorodisilane.

Further embodiments of the present invention provide methods for forming silicon nitride layers including introducing a silicon source into the reactor to chemically react at least a portion of the silicon source with a surface of a substrate; introducing a first purge gas into the reactor to remove an unreacted silicon source from the substrate; introducing a nitrogenous composition into the reactor to form a silicon nitride layer on the substrate by chemically reacting the nitrogenous composition with the chemically reacted silicon source, wherein the nitrogenous composition includes a hydrazine compound, an amine compound or mixture thereof; and introducing a second purge gas into the reactor to remove an unreacted nitrogenous composition from the substrate.

BRIEF DESCRIPTION OF THE DRAWINGS

The above aspects of the present invention will become more apparent by describing, in detail, embodiments of the present invention with reference to the attached drawings in which.

DETAILED DESCRIPTION OF THE INVENTION

Figure 1:
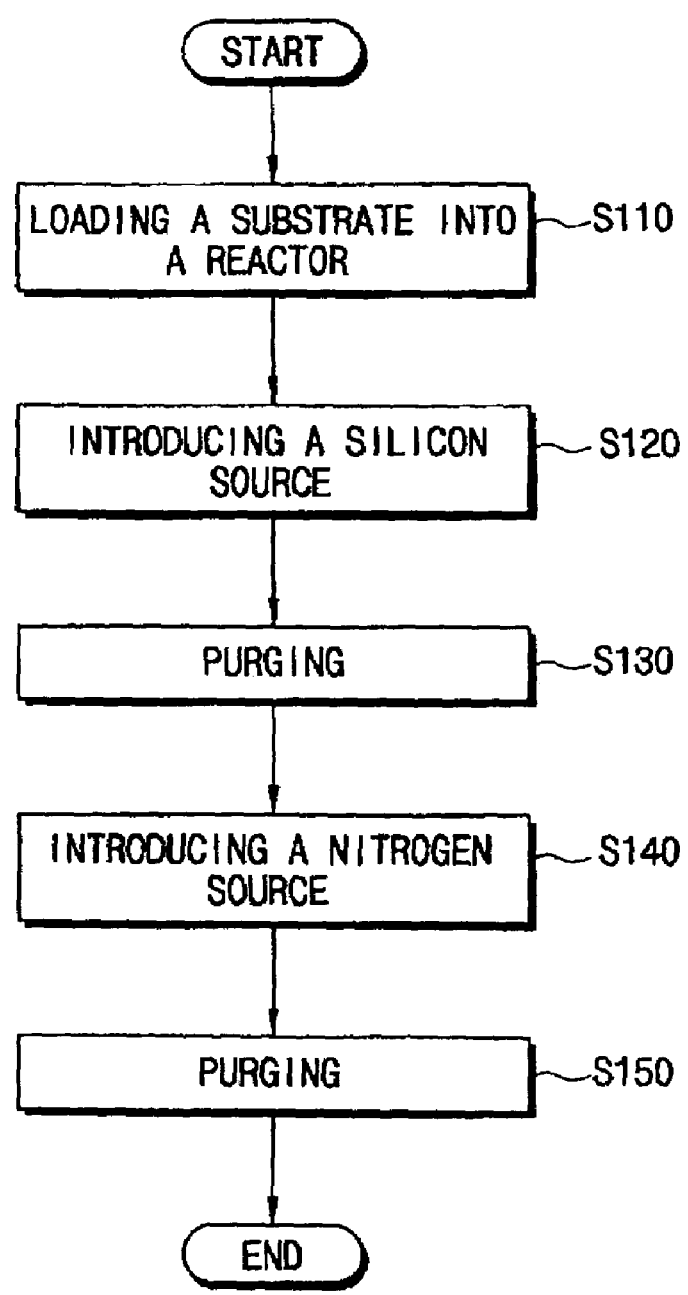
FIG. 1 presents a flow chart illustrating a method for forming a silicon nitride layer in accordance with embodiments of the present invention.

The present invention will now be described more fully herein with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art.

The terminology used in the description of the invention herein is for the purpose of describing particular embodiments only and is not intended to be limiting of the invention. As used in the description of the embodiments of the invention and the appended claims, the singular forms "a", "an" and "the" are intended to include the plural forms as well, unless the context clearly indicates otherwise. As used herein, the term "and/or" includes any and all combinations of one or more of the associated listed items and may be abbreviated as "/".

Unless otherwise defined, all terms, including technical and scientific terms used in the description of the invention, have the same meaning as commonly understood by one of ordinary skill in the art to which this invention belongs. All publications, patent applications, patents, and other references mentioned herein are incorporated by reference in their entirety.

It will be further understood that the terms "includes" and/or "including," when used in this specification, specify the presence of stated features, steps, operations, elements, and/or components, but do not preclude the presence or addition of one or more other features, steps, operations, elements, components, and/or groups thereof.

Moreover, it will be understood that steps including the methods provided herein may be performed independently or at least two steps may be combined. Additionally, steps including the methods provided herein, when performed independently or combined, may be performed at the same temperature or at different temperatures without departing from the teachings of the present invention.

In the drawings, the thickness of layers and regions are exaggerated for clarity. It will also be understood that when a layer is referred to as being "on" another layer or substrate or a reactant is referred to as being introduced, exposed or feed "onto" another layer or substrate, it may be directly on the other layer or substrate, or intervening layers may also be present. However, when a layer, region or reactant is described as being "directly on" or introduced, exposed or feed "directly onto" another layer or region, no intervening layers or regions are present. Additionally, like numbers refer to like compositions or elements throughout.

As will be appreciated by those skilled in the art, the present invention may be embodied as methods of manufacturing devices, using such devices and devices formed according to the methods described herein.

Embodiments of the invention provide silicon nitride layers having desirable properties that are formed at a lower temperature by using a nitrogenous composition, which serves as a nitrogen source. The nitrogenous composition includes a hydrazine compound, an amine compound or a mixture of the hydrazine compound and the amine compound. Non-limiting examples of the hydrazine compound include hydrazine ($N_2H_4$), dimethyl-hydrazine (($CH_3$)$_2N_2H_2$) or a mixture of hydrazine and dimethyl-hydrazine. Non-limiting examples of the amine compound include tertiary-butyl-amine (tert-BuNH$_2$; ($CH_3$)$_3CNH_2$), allyl-amine (allyl NH$_2$: $CH_2$=$CHCH_2NH_2$) or a mixture of tertiary-butyl-amine and allyl-amine.

The dissociation energy of hydrazine is about 297 kJ/mol, the dissociation energy of tertiary-butyl-amine is about 346 kJ/mol and the dissociation energy of allyl-amine is about 290 kJ/mol. However, the dissociation energy of ammonia, one of the conventional nitrogen sources, is about 449 kJ/mol. Thus, the dissociation energy of ammonia is greater than that of hydrazine, tertiary-butyl-amine and allyl-amine. Because hydrazine, tertiary-butyl-amine and allyl-amine have a reactivity higher than that of ammonia, a dense silicon nitride layer having a high nitrogen concentration may be obtained at a lower temperature of, for example, about 300° C. to about 700° C. when the silicon nitride layer is formed using the nitrogenous composition including the hydrazine compound, the amine compound or the mixture thereof. Additionally, since the silicon nitride layer may have a higher etch resistance and a higher breakdown voltage, the thermal deterioration of a semiconductor device including the silicon nitride layer may be reduced.

When the nitrogenous composition including the hydrazine compound, the amine compound or the mixture thereof is employed as a nitrogen source for forming a silicon nitride layer, a silicon source that is reacted with the nitrogenous composition for forming the silicon nitride layer may include hexachlorodisilane ($Si_2Cl_6$). The amount of the silicon source may be adjusted to better control the deposition rate and the thickness of the silicon nitride layer. Additionally, the refractive index of the silicon nitride layer may be adjusted by controlling the amount of the silicon source. When the nitrogenous composition and hexachlorodisilane are employed as the nitrogen source and the silicon source, respectively, the silicon nitride layer may have an improved etch resistance and a lowered refractive index in comparison with a silicon nitride layer formed by a conventional method. Additionally, the thickness of the silicon nitride layer may be controlled when the nitrogenous composition and hexachlorodisilane are employed as the nitrogen source and the silicon source, respectively.

In further embodiments of the present invention, the silicon nitride layer may be formed on a substrate by a chemical vapor deposition (CVD) process or an atomic layer deposition (ALD) using the nitrogen composition and the silicon source, which are described above.

Methods for forming a silicon nitride layers using nitrogenous compositions of the present invention will be described in reference to the accompanying figures.

Referring to FIG. 1, a flow chart illustrating a method for forming a silicon nitride layer in accordance with an embodiment of the present invention is presented. More specifically, a substrate is loaded into a reactor in step S110. A silicon source is introduced into the reactor so that a portion of the silicon source chemically reacts with the surface of the substrate in step S120.

In step S130, a first purge gas is introduced into the reactor so that a portion of the silicon source that is not chemically reacted with the substrate is removed from the reactor. Thus, any unreacted portion, if any, of the silicon source may be removed from the substrate.

In step S140, a nitrogenous composition is introduced into the reactor so that a portion of the nitrogenous composition is chemically reacted with the chemically reacted silicon source on the substrate. The nitrogenous composition may include a hydrazine compound, an amine compound or a mixture of the hydrazine compound and the amine compound. Consequently, a silicon nitride layer is formed on the substrate.

In step S150, a second purge gas is introduced into the reactor, which may remove a portion, if any, of the nitrogenous composition that is not chemically reacted with the chemically reacted silicon source from the substrate. As a result, a dense silicon nitride layer is formed on the substrate.

In particular, the steps for forming the silicon nitride layer by employing an atomic layer deposition (ALD) process will be further described in detail. However, a chemical vapor deposition (CVD) process may also be employed for forming a silicon nitride layer.

Referring again to FIG. 1, in step S110, the substrate is loaded into the reactor. Non-limiting examples of the reactor may include a chemical vapor deposition chamber or an atomic layer deposition chamber. A non-limiting example of the substrate may include a silicon substrate. Underlying structures, for example, gate structures, pads, contacts or insulation layers may also be formed on the substrate. The substrate may be transferred into the reactor using a transferring member, for example, a robotic arm.

In step S120, the silicon source is provided onto the substrate in the reactor so that at least a portion of the silicon source is reacted with components included in the substrate. The silicon source may include hexachlorodisilane ($Si_2Cl_6$) so as to form the silicon nitride layer having desirable characteristics on the substrate at a relatively low temperature. Particularly, hexachlorodisilane is reacted with the components in the substrate so that a portion of hexachlorodisilane is chemically absorbed on the substrate. Additionally, another portion of hexachlorodisilane is physically absorbed on the substrate.

The first purge gas is introduced into the reactor, thereby removing unreacted silicon source from the substrate in step S130. In particular, the physically absorbed silicon source is removed from the reactor by providing the first purge gas into the reactor in step S130. The first purge gas may include an inactive gas such as a nitrogen ($N_2$) gas, a helium (He) gas, a neon (Ne) gas, an argon (Ar) gas, and the like. The first purge gas removes the physically absorbed hexachlorodisilane from the substrate.

In step S140, the nitrogen source is provided onto the substrate to form the silicon nitride layer on the substrate. The nitrogen source may include a nitrogenous composition. Non-limiting examples of the nitrogenous composition may include a hydrazine compound, an amine compound or a mixture of the hydrazine compound and the amine compound. Non-limiting examples of the hydrazine compound may include hydrazine ($N_2H_4$), dimethyl-hydrazine (($CH_3$)$_2N_2H_2$) or a mixture of hydrazine and dimethyl-hydrazine. In addition, non-limiting examples of the amine compound may include tertiary-butyl-amine (tert-BuNH$_2$: ($CH_3$)$_3CNH_2$), allyl-amine (allylNH$_2$:$CH_2$=$CHCH_2NH_2$) and a mixture of tertiary-butyl-amine and allyl-amine.

The dissociation energy of ammonia may be greater than that of hydrazine, tertiary-butyl-amine or allyl-amine. Thus, the reactivity of hydrazine, tertiary-butyl-amine or allyl-amine may be higher than that of ammonia. As a result, the dense silicon nitride layer including rich nitrogen may be formed on the substrate at a relatively low temperature, for example, about 300° C. to about 700° C., using the nitrogenous composition including the hydrazine compound, the amine compound or the mixture thereof. Additionally, the thermal damage to a semiconductor device may be prevented when the dense silicon nitride layer is formed at the low temperature. Furthermore, the dense silicon nitride layer may have desirable characteristics such as a high etch resistance and a high breakdown voltage.

The nitrogenous composition in an activated state may be introduced into the reactor. The nitrogenous composition may be activated using a direct plasma apparatus, a remote plasma apparatus, an ultraviolet ray, and the like.

In step S150, the second purge gas is introduced into the reactor to remove the unreacted nitrogen source from the substrate. The second purge gas may include an inactive gas such as a nitrogen ($N_2$) gas, a helium (He) gas, a neon (Ne) gas, an argon (Ar) gas, and the like. The second purge gas may remove a portion, if any, of the nitrogen source that is not chemically reacted with the silicon source from the substrate.

Steps S110 to S150, described above, are performed at a temperature in a range of about 300° C. to about 700° C. under a pressure in a range of about 0.1 Torr to about 10 Torr. In an instance when steps S110 to S150 are carried out at a temperature in a range of below about 300° C., the silicon nitride layer may have undesirable characteristics and the deposition efficiency of the silicon nitride layer may decrease. When steps S110 to S15 are performed at a temperature of above about 700° C., the semiconductor device including the silicon nitride layer may exhibit thermal damage.

The silicon nitride layer of the present invention may have a refractive index of about 1.7 to about 2.3, and a composition ratio between nitrogen (N) and silicon (Si) of about 1 to about 1.6. Since the silicon nitride layer may possess desirable physical and chemical characteristics, the silicon layer may be employed as a mask layer or an insulation layer in a semiconductor device.

In other embodiments of the present invention, steps S120 to S150 may be executed repeatedly to form the silicon nitride layer having a predetermined thickness on the substrate. Because the thickness of the silicon nitride layer may be in a range of about 0.5 Å to about 30 Å by performing one cycle of steps S120 to S150, the thickness of the silicon nitride layer may be adjusted by properly repeating the steps S120 to S150.

The embodiments of the present invention will now be further described with reference to a non-limiting example and comparative examples presented hereinbelow.

EXAMPLE

A silicon nitride layer was formed on a substrate using a silicon source including hexachlorodisilane (HCD) and a nitrogen source including tertiary-butyl-amine (tert-BuNH$_2$: ($CH_3$)$_3CNH_2$). The silicon nitride layer was formed at a temperature of about 570° C. in an atomic layer deposition chamber.

Comparative Examples 1 to 3

Silicon nitride layers were formed on substrates using an atomic layer deposition chamber. The silicon sources, nitrogen sources and reaction temperature were different from those of the example noted above. Table 1 presents the silicon sources, the nitrogen sources and the reaction temperature.

TABLE 1

|  | silicon source | nitrogen source | reaction temperature (° C.) |
| --- | --- | --- | --- |
| Example | HCD | TAB | 570 |
| Comparative Example 1 | HCD | $NH_3$ | 570 |
| Comparative Example 2 | HCD | $NH_3/C_2H_4$ | 570 |
| Comparative Example 3 | DCS | $NH_3$ | 680 |

TABLE 1-continued

|  | silicon source | nitrogen source | reaction temperature (° C.) |
| --- | --- | --- | --- |

Measurements of Characteristics of the Silicon Nitride Layers

The characteristics of the silicon nitride layers of the Example and Comparative Examples 1 to 3 were measured. Particularly, the thickness, the refractive indices and the etch rates of the silicon nitride layers were measured. The thickness of the silicon nitride layers were measured by the cycle according to the above-described steps, and the etch rates of the silicon nitride layers were measured using hydrogen fluoride (HF) solution diluted with water by a ratio of about 1:100. The measured results are shown in Table 2 and FIGS. 2 to 4.

Figure 2:
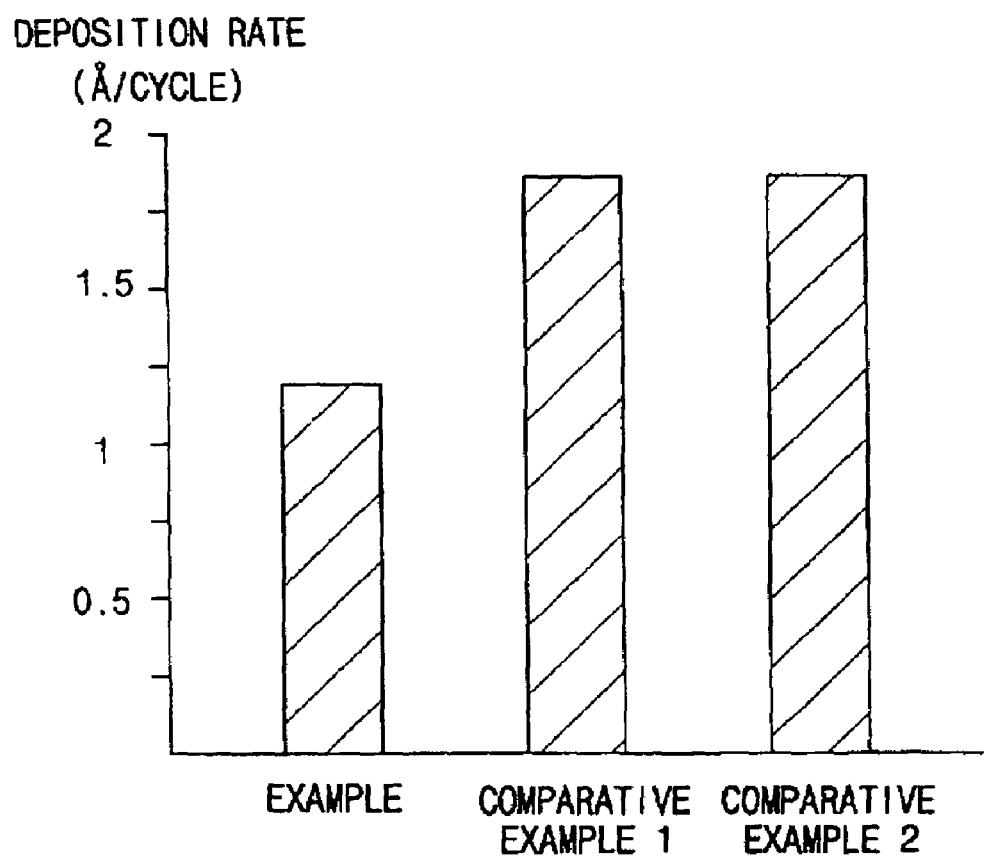
FIG. 2 presents a graph illustrating deposition rates of silicon nitride layers of the Example and Comparative Examples presented in accordance with embodiments of the present invention.
Figure 3:
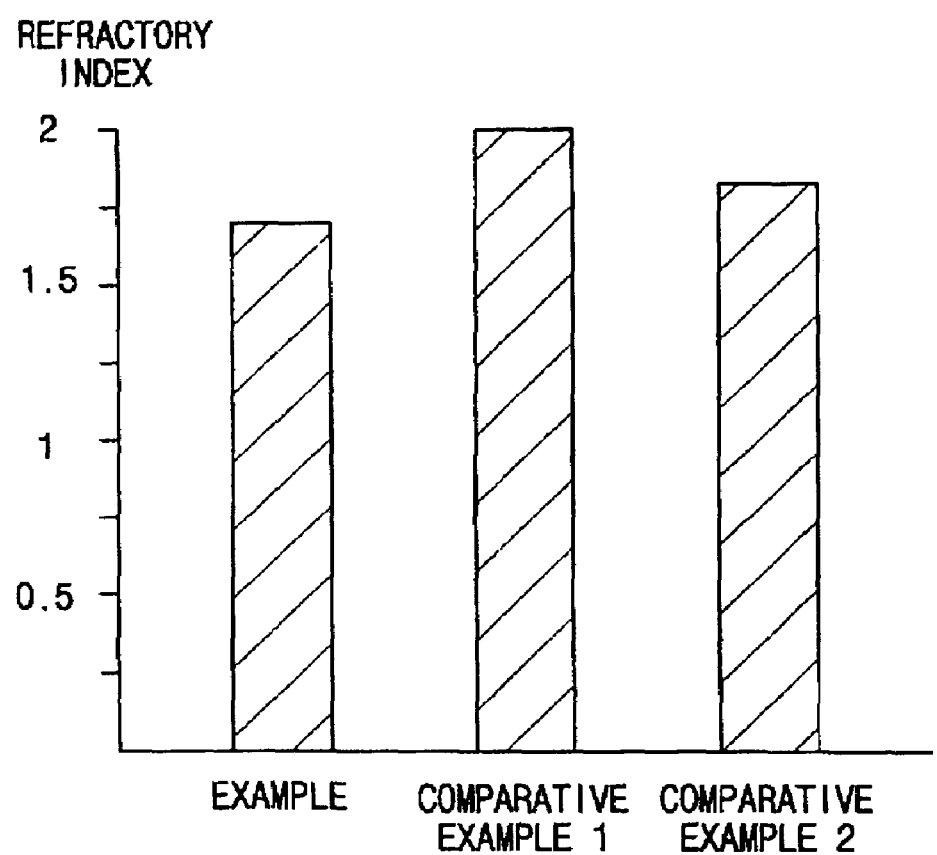
FIG. 3 presents a graph illustrating refractive indices of silicon nitride layers of the Example and Comparative Examples in accordance with embodiments of the present invention.
Figure 4:
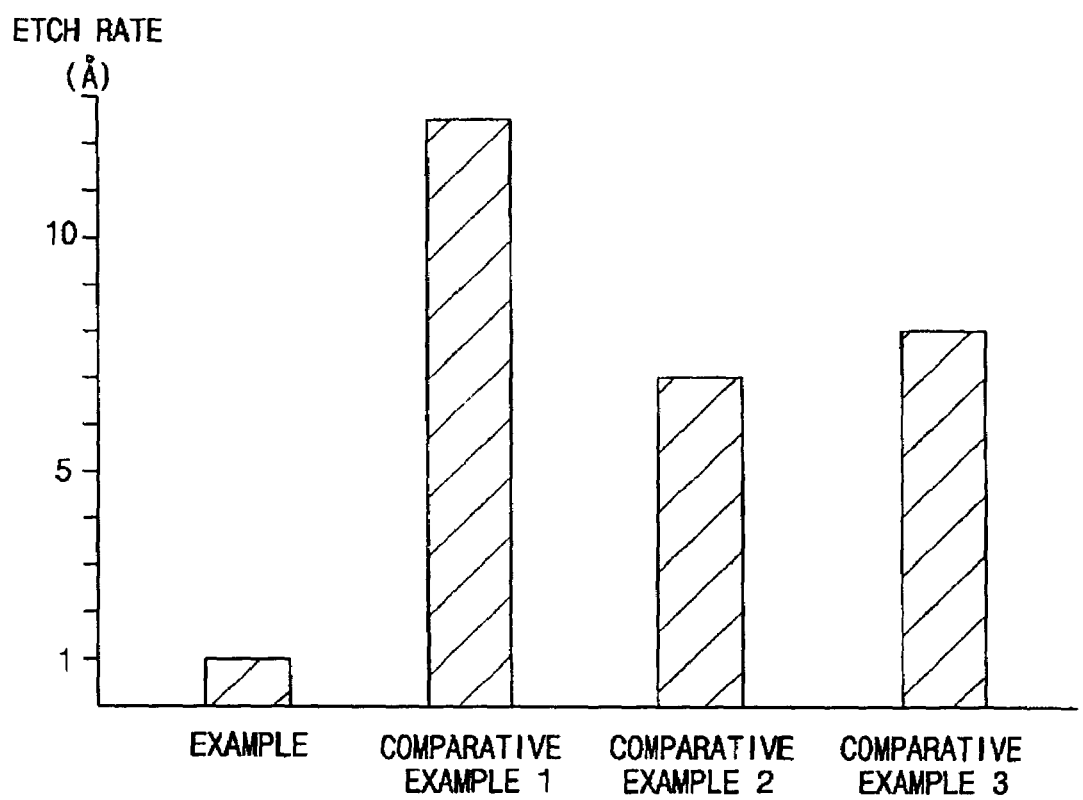
FIG. 4 presents a graph illustrating etching rates of silicon nitride layers of the Example and Comparative Examples in accordance with embodiments of the present invention.

FIG. 2 presents a graph showing the deposition rates of the silicon nitride layers of the Example and Comparative Examples 1 and 2. FIG. 3 presents a graph showing the refractive indices of the silicon nitride layers of the Example and Comparative Examples 1 and 2. FIG. 4 presents a graph showing the etch rates of the silicon nitride layers of the Example and Comparative Examples 1 to 3.

TABLE 2

|  | thickness (Å/cycle) | refractive index | etch rate |
| --- | --- | --- | --- |
| Example | 1.2 | 1.93 | 1.0 |
| Comparative Example 1 | 1.8 | 2.0 | 12.5 |
| Comparative Example 2 | 1.8 | 1.975 | 7.0 |
| Comparative Example 3 | — | — | 8.0 |

Referring to Table 2 and FIGS. 2 to 4, the silicon nitride layer of the Example presents desirable properties such as a higher etch resistance and a lower refractive index in comparison with those of the silicon nitride layers of Comparative Examples 1 to 3. In addition, a deposition rate of the silicon nitride layer of Example may be better controlled compared to the deposition rate of the silicon nitride layers of Comparative Examples 1 to 3.

According to embodiments of the present invention, novel nitrogenous compositions are employed as a nitrogen source for forming silicon nitride layers so that a silicon nitride layer having desirable characteristics may be formed on a substrate. Since the silicon nitride layer may have an improved breakdown voltage and an enhanced etch resistance, the silicon nitride layer may be employed for an etch stop layer or an insulation layer in a semiconductor device. In addition, a semiconductor device including the silicon nitride layer may exhibit little to no thermal damage because the silicon nitride layer is formed at a low temperature.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method for forming a silicon nitride layer comprising:
   introducing a silicon source comprising hexachlorodisilane into a reactor to chemically react at least a portion of the silicon source with a surface of a substrate;
   introducing a first purge gas into the reactor to remove an unreacted silicon source from the substrate;
   introducing an activated nitrogenous compound into the reactor to form a silicon nitride layer on the substrate by chemically reacting the activated nitrogenous compound with the chemically reacted silicon source, wherein the activated nitrogenous compound comprises a hydrazine compound, an amine compound or mixture thereof; and
   introducing a second purge gas into the reactor to remove an unreacted activated nitrogenous compound from the substrate, wherein the silicon nitride layer has a refractive index in a range of about 1.7 to about 2.3.

2. The method of claim 1, wherein introducing the silicon source, introducing the first purge gas, introducing the activated nitrogenous compound and introducing the second purge gas are performed repeatedly.

3. The method of claim 2, wherein performing one cycle of introducing the silicon source, introducing the first purge gas, introducing the activated nitrogenous compound and introducing the second purge gas produces a silicon nitride layer having a thickness of about 0.5 Å to about 30 Å.

4. The method of claim 1, wherein introducing the silicon source, introducing the first purge gas, introducing the activated nitrogenous compound and introducing the second purge gas are performed at a temperature less than about 600° C.

5. The method of claim 1, wherein the reactor comprises a chemical vapor deposition chamber or an atomic layer deposition chamber.

6. The method of claim 1, wherein the activated nitrogenous compound is formed using a direct plasma apparatus, a remote plasma apparatus or an ultraviolet ray.

7. The method of claim 1, wherein the first and second purge gases comprise inactive gases, respectively.

8. The method of claim 1, wherein the silicon nitride layer has a composition ratio between nitrogen and silicon of about 1 to about 1.6.

9. The method of claim 1, wherein the silicon nitride layer has a higher etch resistance and/or a lower refractive index compared to a silicon nitride layer formed by a conventional method.

10. The method of claim 1, wherein introducing the silicon source, introducing the first purge gas, introducing the activated nitrogenous compound and introducing the second purge gas are performed at a temperature in a range of about 300° C. to about 700° C.

11. The method of claim 1, wherein introducing the silicon source, introducing the first purge gas, introducing the activated nitrogenous compound and introducing the second purge gas are performed under a pressure in a range of about 0.1 Torr to about 10 Torr.

* * * * *